United States Patent
Kunii et al.

(10) Patent No.: US 6,252,252 B1
(45) Date of Patent: Jun. 26, 2001

(54) OPTICAL SEMICONDUCTOR DEVICE AND OPTICAL SEMICONDUCTOR MODULE EQUIPPED WITH THE SAME

(75) Inventors: Hideo Kunii; Toshiyuki Take; Hiroshi Inoguchi; Tsutomu Ishikawa; Masashi Arai; Hiroshi Kobori; Hiroki Seyama; Kiyoshi Takada; Satoru Sekiguchi, all of Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/291,202

(22) Filed: Apr. 14, 1999

(30) Foreign Application Priority Data

| Apr. 16, 1998 | (JP) | 10-106399 |
|---|---|---|
| May 14, 1998 | (JP) | 10-131728 |
| Jun. 8, 1998 | (JP) | 10-158937 |
| Jul. 31, 1998 | (JP) | 10-218194 |
| Jul. 31, 1998 | (JP) | 10-218196 |
| Aug. 31, 1998 | (JP) | 10-245241 |

(51) Int. Cl.[7] .................. H01L 27/15; H01L 31/12; H01L 31/0203; H01L 31/0232
(52) U.S. Cl. .................. 257/81; 257/80; 257/82; 257/433; 257/436; 438/116
(58) Field of Search .................. 257/80–82, 433, 257/434, 436; 438/116

(56) References Cited

U.S. PATENT DOCUMENTS

| 5,606,181 | * | 2/1997 | Sakuma et al. | 257/88 |
|---|---|---|---|---|
| 5,748,658 | * | 5/1998 | Nakanishi et al. | 372/43 |
| 5,753,857 | * | 5/1998 | Choi | 174/52.4 |
| 5,801,402 | * | 9/1998 | Shin | 257/80 |
| 5,881,084 | * | 3/1999 | Huang et al. | 372/43 |
| 5,883,913 | * | 3/1999 | Doi et al. | 372/50 |
| 6,051,848 | * | 4/2000 | Webb | 257/99 |

* cited by examiner

Primary Examiner—Eddie C. Lee
Assistant Examiner—Allan R. Wilson
(74) Attorney, Agent, or Firm—Armstrong, Westerman, Hattori, McLeland & Naughton, LLP

(57) ABSTRACT

A mold 25 for molding semiconductor chips 23 and 24 serving as a light emitting element and a light receiving element, respectively, is made of a material capable of transmitting light. A groove 27 is formed on the region where light is emitted from and incident on the semiconductor chips so that it constitutes a reflecting face. Thus, the light is emitted and incident through the side E of the mold. In this configuration, the outer size of the light receiving element or light emitting element can be minimized, and the module provided with these semiconductor chips can also be miniaturized.

14 Claims, 15 Drawing Sheets

FIG. 25
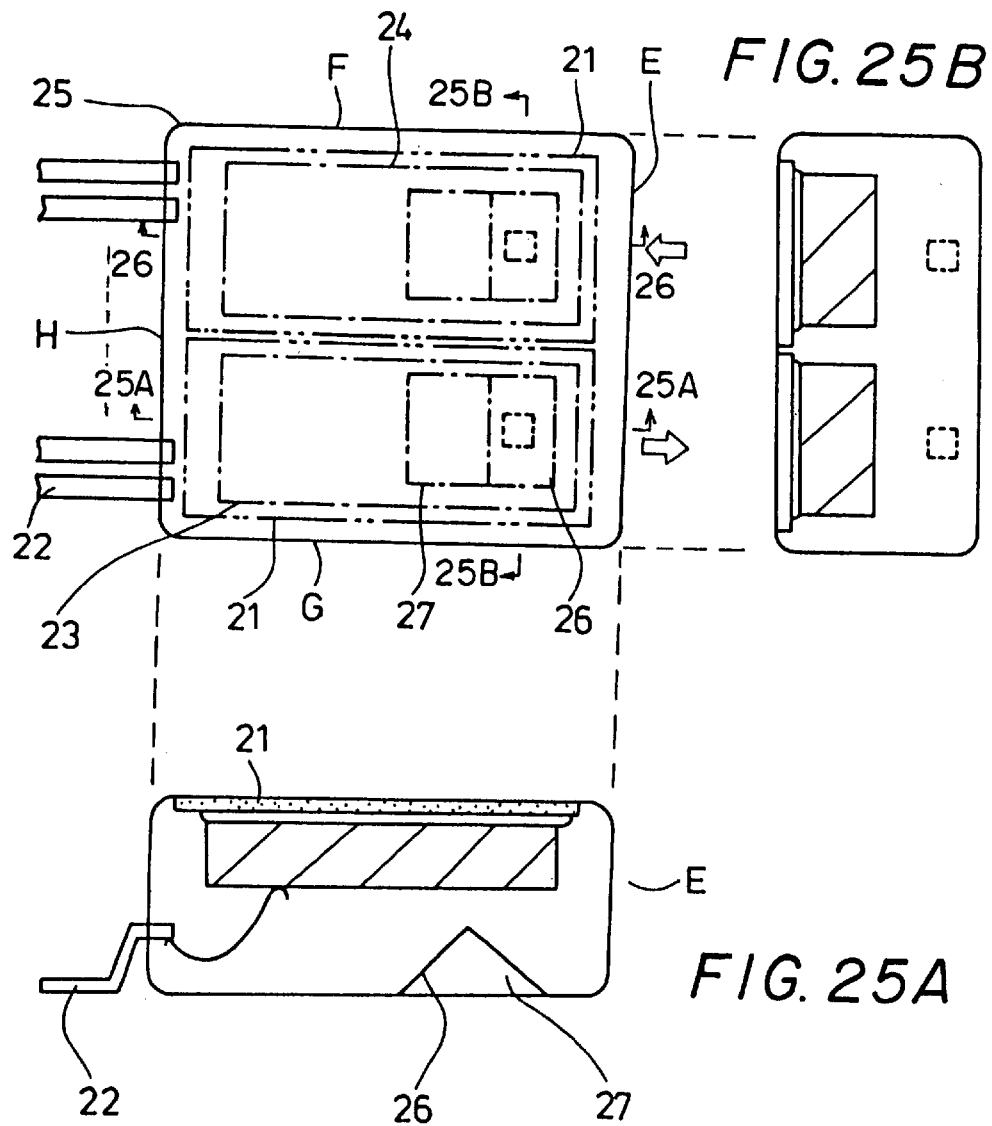
FIG. 25B
FIG. 25A
FIG. 26
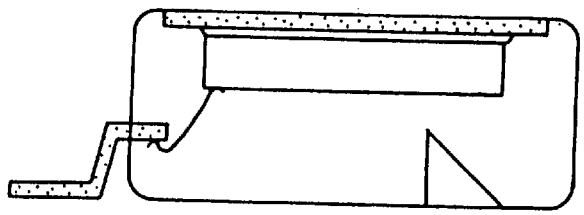

FIG. 27
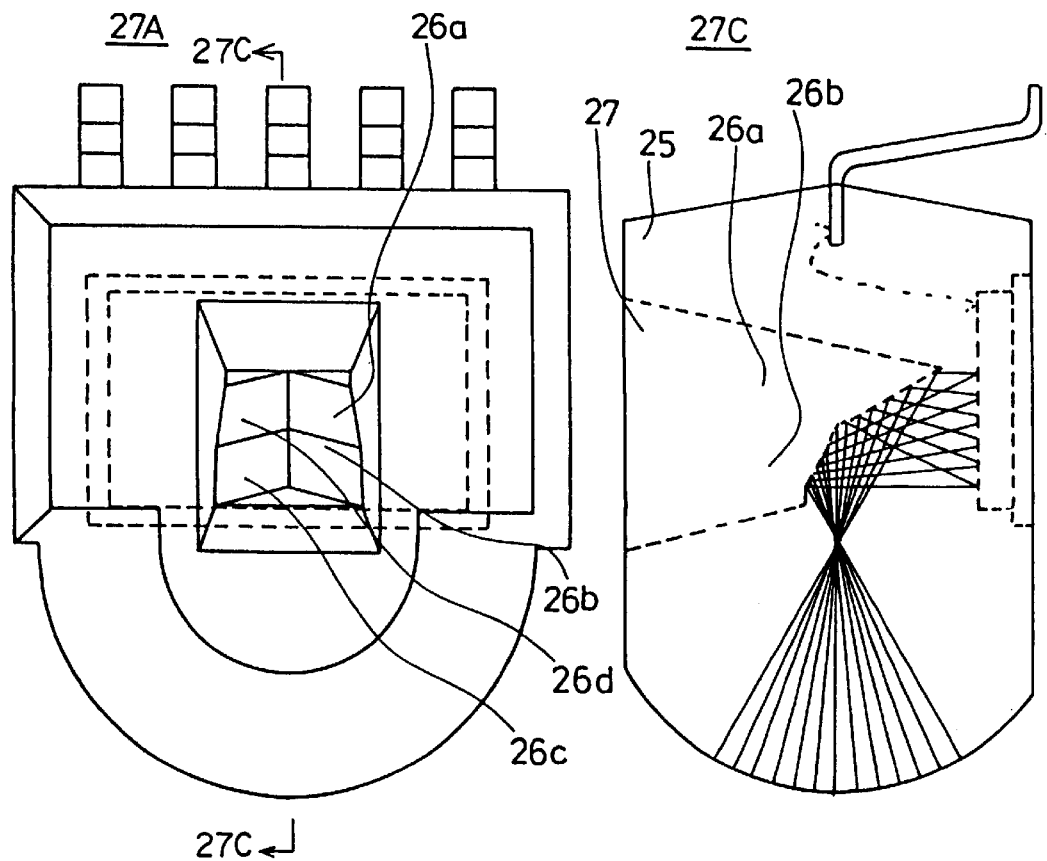
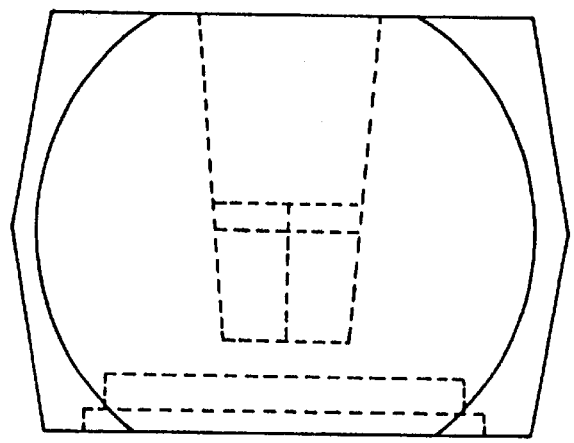

OPTICAL SEMICONDUCTOR DEVICE AND OPTICAL SEMICONDUCTOR MODULE EQUIPPED WITH THE SAME

BACKGROUND OF THE INVENTION

1. Field of the Invention

The present invention relates to an optical semiconductor device and an optical semiconductor module equipped with it, and more particularly to those with a low-profiled structure of the optical semiconductor device which light is incident to or exits from. The present invention intends to realize the compacting or low-profiling of the components using them.

2. Description of the Related Art

In recent years, multi-media components such as a "sub-note personal computer", a portable information terminal, electronic still camera, etc. are developing rapidly.

In addition, seven million portable components are sold in a year, and about 80% of them adopt an infrared rays system in IrDA (Infrared Data Association) standard. This system requires transmission/reception between an external device and a main body using an infrared ray signal. Therefore, a light emitting element for emitting infrared rays and a light receiving element for receiving them are required.

Further, the optical head used in an optical recording/playing device such as an "MD" or "CD" makes recording/reproducing information by irradiating an optical recording medium with a beam and detecting the modulated beam therefrom. In this case, the light emitting element and light receiving element are required.

However, these light emitting elements and light receiving elements have not been miniaturized sufficiently. FIG. 15 shows an example of a semiconductor device equipped with an optical device which is disclosed in Japanese Patent Publication. 7-28085. In FIG. 15, a semiconductor laser 1 is directly placed on a semiconductor substrate 2, and a prism 3 having a trapezoidal sectional shape is secured on the semiconductor substrate 2. Reference numeral 4 denotes an optical recording medium.

A slope 5 of the prism 3 opposite to the semiconductor laser 1 is a semi-transparent reflecting face. A prism face 6 in contact with the semiconductor substrate 2 constitutes a reflecting face at the other portion than a photodetector (light-receiving element) 7. A prism face 8 opposite to the face 6 also constitutes a reflecting face.

A beam 9, which is emitted from the semiconductor laser 1 and is incident on the prism 3 from the slope 5, is reflected from the reflecting faces 6 and 8, and detected by a photodetector 7.

On the other hand, FIG. 16 shows an infrared ray data communication module 11 incorporating an infrared ray LED, LED driver, PIN photodiode and an amplifier, etc. In this module, light emitted from the LED 12 mounted on a substrate is caused to exit through a lens 13. The light is incident on a photodiode 14 mounted on the substrate through a lens 15.

The module as shown in FIG. 15, in which the optical component is mounted above the semiconductor substrate, requires a very sophisticated technique and is high in production cost.

In the module as shown in FIG. 16, emission or reception of light must be made on a mold body and another semiconductor device must be set at an opposite position. Therefore, the entire resultant system is increased in thickness and cannot be miniaturized.

If the emission or reception of light in a horizontal direction is intended in the module in FIG. 16, a lead 16 to the optical semiconductor device 11 must be bent at 90°. The manner of bending the lead 11 influences the stability of securing the semiconductor device 11.

SUMMARY OF THE INVENTION

An object of the present invention is to provide an optical semiconductor device which can be easily manufactured and easily miniaturized and low-profiled.

Another object of the present invention is to provide an optical semiconductor module equipped with such an optical semiconductor device.

Still another object of the present invention is to provide a method of manufacturing such a semiconductor device.

A first aspect of the device is an optical semiconductor device of the present invention which comprises:

a semiconductor chip having a light emitting face or a light receiving face; and a mold for molding said semiconductor chip, having a reflecting face arranged to form a prescribed angle with said light emitting face or light receiving face, wherein an optical path of light exiting from or being incident on said semiconductor chip is bent through said reflecting face.

A second aspect of the device is an optical semiconductor device according to the first aspect, wherein said semiconductor chip is a chip having the light receiving face, said mold has the reflecting face arranged to cross a perpendicular line of the light receiving face at a prescribed angle, and said optical path is formed so that the light incident from a side of said mold is bent by said reflecting face and incident on said light receiving face.

A third aspect of the device is an optical semiconductor device according to the first aspect, wherein said semiconductor chip is a chip having the light emitting face, said mold has the reflecting face arranged to cross a perpendicular line of the light emitting face at a prescribed angle, and said optical path is formed to exit at the prescribed angle with respect to a light emitting direction through said reflecting face.

A fourth aspect of the device is an optical semiconductor device according to the third aspect, wherein said semiconductor chip is connected to a lead extended from a first side of said mold, and the light emitted from the semiconductor chip is caused to exit through said reflecting face from a second side of said mold opposite to said first side.

A fifth aspect of the device is an optical semiconductor device according to the third aspect, wherein said semiconductor chip is a chip having the light emitting face on its side, and the light emitted from said semiconductor chip is caused to emit through the reflecting face from an upper face of said mold.

A sixth aspect of the device is an optical semiconductor device according to the third aspect, wherein said mold is made of resin capable of transmitting at least prescribed light, and a face formed in the mold itself constitutes said reflecting face.

A seventh aspect of the device is an optical semiconductor device according to the sixth aspect, wherein said reflecting face is a slope of the groove formed in said mold.

An eighth aspect of the device is an optical semiconductor device according to the first aspect, wherein said mold is made of a hollow package of a first material not constituting the optical path, said package is provided in its opening with means made of a second material capable of transmitting at least prescribed light and constituting the optical path, and a face formed in said means itself constitutes said reflecting face.

A ninth aspect of the device is an optical semiconductor device according to the eighth aspect, wherein said first material is ceramic or metal, and said second material is glass or resin capable of transmitting at least prescribed light.

A tenth aspect of the device is an optical semiconductor device according to the ninth aspect, wherein said reflecting face is a slope of the groove formed in said second material.

An eleventh aspect of the device is an optical semiconductor device according to the first aspect, which further comprises:

a lead frame having an island on which said semiconductor is placed; and a lead electrically connected to said semiconductor chip and extended externally from said mold, said lead being extended from a side opposite to a side on which light is incident.

A twelfth aspect of the device is an optical semiconductor module including the optical semiconductor device according to the first aspect, which further comprises:

a supporting substrate on which said semiconductor chip is placed;

a lead electrically connected to said semiconductor chip and extended externally from said supporting substrate, said lead being extended from a side opposite to a side which light is incident on or exits from.

A thirteenth aspect of the device is an optical semiconductor module according to the twelfth aspect, wherein said semiconductor chip is provided with a first semiconductor element section for emitting or receiving light and a second semiconductor element section for driving it, and said second semiconductor element is arranged in vicinity of said lead.

A fourteenth aspect of the device is an optical semiconductor module according to the twelfth aspect, wherein the light emitting face or light receiving face of said optical semiconductor chip is in parallel to a surface of a substrate in which the optical semiconductor chip is mounted.

A fifteenth aspect of the device is an optical semiconductor module according to the fourteenth aspect, wherein the groove constituting said reflecting face is arranged so as to oppose to a mounting substrate on which said optical semiconductor device is placed, and the optical path is formed to reach said light receiving face or light emitting face through said reflecting face from a side perpendicular to the upper surface of said mold.

A sixteenth aspect of the device is an optical semiconductor module including a semiconductor device according to the first aspect, wherein said semiconductor chip is composed of a single chip or a plurality of chips.

A seventeenth aspect of the device is an optical semiconductor module according to the thirteenth aspect, wherein said substrate is built in an IC card, and optical communication is carried out from a thinner side of the card.

An eighteenth aspect of the device is an optical semiconductor device according to the first aspect, wherein said semiconductor chip has an upper face serving as the light receiving face, and said mold is made of resin capable of transmitting at least prescribed light, and has the reflecting face arranged to cross a perpendicular line of the light receiving face at a prescribed angle, and a convex lens provided integrally to the side of said mold.

A nineteenth aspect of the device is an optical semiconductor device according to the sixteenth aspect, wherein said mold is provided with a lead whose upper face is flush with an extreme end of said convex lens.

A twentieth aspect of the device is an optical semiconductor device according to the sixteenth aspect, wherein a vertical segment composed of a lowest end of said convex lens and a focal point of said lens crosses said reflecting face.

A twenty-first aspect of the method is a method of manufacturing a semiconductor device of the present invention which comprises the steps of:

arranging a mounting substrate on which a semiconductor chip having a light receiving face or light emitting face is mounted within a space formed by an upper die and a lower die; and injecting resin capable of transmitting at least prescribed light into the space to mold said semiconductor chip to provide a resin mold, wherein said upper die has an inner wall located to cross a perpendicular line to the light receiving face or light emitting face and constitutes a reflecting face formed in said resin mold, and said resin mold is provided in such a manner that the resin is injected in the space in a state where an extreme end in a protruding direction of a lens portion integrally molded to the side of said resin mold is substantially aligned with a junction of said upper die or lower die.

A twenty-second aspect of the method is a method of manufacturing an optical semiconductor device according to the twenty-first aspect, wherein said inner wall is mirror-finished and the remaining portion is satin-finished.

In accordance with the first to fifth inventions, an optical semiconductor device comprises a semiconductor chip having a light emitting face or a light receiving face; and a mold (sealing body) for molding (sealing) the semiconductor chip, having a reflecting face arranged to form a prescribed angle with the light emitting face or light receiving face. In addition, an optical path of light exiting from or being incident on the semiconductor chip is bent through the reflecting face.

In this configuration, the optical semiconductor device can be miniaturized and low-profiled.

Particularly, since light can be incident or exit through the reflecting face from the side of the mold, the optical semiconductor device can be further low-profiled. Further, by integrally or individually providing the mold with means having the reflecting face, with the optical semiconductor device located horizontally, the incident light or exit light can be made horizontal. The positioning precision of the optical path can be improved. If these optical semiconductor devices are located at opposite sides, optical communication can be carried out horizontally.

The light can be caused to exit through the reflecting face from the upper face of the mold. Therefore, by integrally or individually providing the mold with means having the reflecting face, with the optical semiconductor device located horizontally, the incident light or exit light can be made vertical. This permits the optical semiconductor device to be manufactured at very low cost.

In accordance with the sixth invention, the mold is made of resin capable of transmitting at least prescribed light, and a face formed in the mold itself constitutes the reflecting face. Therefore, the reflecting face can be formed simultaneously with the process of resin molding the semiconductor chip. This makes the prism as shown in FIG. 15 unnecessary. Thus, the process of assembling the optical semiconductor device can be simplified and the production cost can be reduced. A module which can be obtained by mounting the optical semiconductor device on a substrate such as a printed board can be low-profiled.

In accordance with the seventh invention, the slope of the groove formed in the mold serves as the reflecting face. Therefore, the reflecting face can be easily formed by only providing a convex portion constituting the groove in a molding die. The molding die itself can be simplified. Further, the reflecting face can be mirror-finished by polishing the groove.

In accordance with the eighth invention, the mold is made of a hollow package of a first material not constituting the optical path, and the package is provided in its opening with means made of a second material capable of transmitting at least prescribed light and constituting the optical path, and a face formed in the means itself constitutes the reflecting face.

In accordance with the ninth invention, when a hollow package made of ceramic, metal, or resin is used as the mold, means constituting the optical path made of glass or resin is provided as shown in FIGS. 7 and 8. Thus, the exit light or incident light can be made horizontal.

In accordance with the tenth invention, the reflecting face is constructed of a slope of the groove formed in the second material.

In accordance with the eleventh invention, the semiconductor chip is placed on an island (a die-pad) of a lead frame, and a lead is extended externally from the island through a side opposite to the side on which light is incident. In this configuration, the reflection of light through the lead frame or metallic lead removes optical noise.

In accordance with the twelfth invention, the semiconductor chip is placed on a supporting substrate such as a ceramic substrate, a printed board or a metallic substrate with its surface insulated, and a lead is extended externally from the substrate through the side opposite to a side on which light is incident. In this configuration, the reflection of light through the lead frame or metallic lead removes optical noise.

In accordance with the thirteenth invention, the semiconductor chip is provided with a first semiconductor element section for emitting or receiving light and a second semiconductor element section for driving it, and the second semiconductor element is arranged in vicinity of the lead.

In this configuration, the second semiconductor element section does not serve as the optical path so that this section can be used as a region for extending the lead or metallic wires. This eliminates necessity of taking optical noise owing to light reflection into consideration.

In accordance with the fourteenth invention, since the optical semiconductor is horizontally mounted on a substrate, a module having a low-profiled or simple structure can be manufactured at low cost.

An optical IC using the such a module can be low-profiled at low cost.

In accordance with the fifteenth invention, the groove is arranged on the side of the substrate for mounting, and the semiconductor chip is sandwiched between the substrate for mounting and island or supporting substrate. This implements optical detection with no optical noise and with high reliability.

In accordance with the sixteenth invention, the semiconductor chip has a light emitting function and a light receiving function so that an optical module which is miniaturized and has a high level of function can be obtained.

In accordance with the seventeenth invention, building the substrate in an IC card provides a very low-profiled and high reliable optical module.

In accordance with the eighteenth invention, since a convex lens formed by integral molding is provided on the side of the mold, a miniaturized optical module with high light convergence can be obtained.

In accordance with the nineteenth invention, the upper face of the lead is flush with an extreme end of the convex lens. Therefore, with no burr in resin molding, a highly reliable optical semiconductor device can be obtained.

In accordance with the twentieth invention, the groove is deeply formed so that the virtual segment crosses the reflecting face, thereby implementing the reflection with high efficiency.

In accordance with the twenty-first invention, the extreme end in a protruding direction of the lens portion is substantially aligned with a junction of the upper die and lower die for molding the resin mold. Thus, the parting or separating property of a mold product can be improved so that the optical semiconductor device with high reproducibility can be manufactured very easily.

In accordance with the twenty-second invention, the inner wall of the molding die is partially mirror-finished or satin-finished so that the reflecting face can be very easily formed with high selectivity and reproducibility.

The above and other objects and features of the present invention will be more apparent from the following description taken in conjunction with the accompanying drawings.

BRIEF DESCRIPTION OF THE DRAWINGS

FIG. 25 is a view for explaining the details of the optical semiconductor device;

FIG. 26 is a view for explaining a groove shown in FIG. 25; and

FIG. 27 is a view for explaining the optical semiconductor device according to the present invention.

DESCRIPTION OF THE PREFERRED EMBODIMENTS

Embodiment 1

Figure 1:
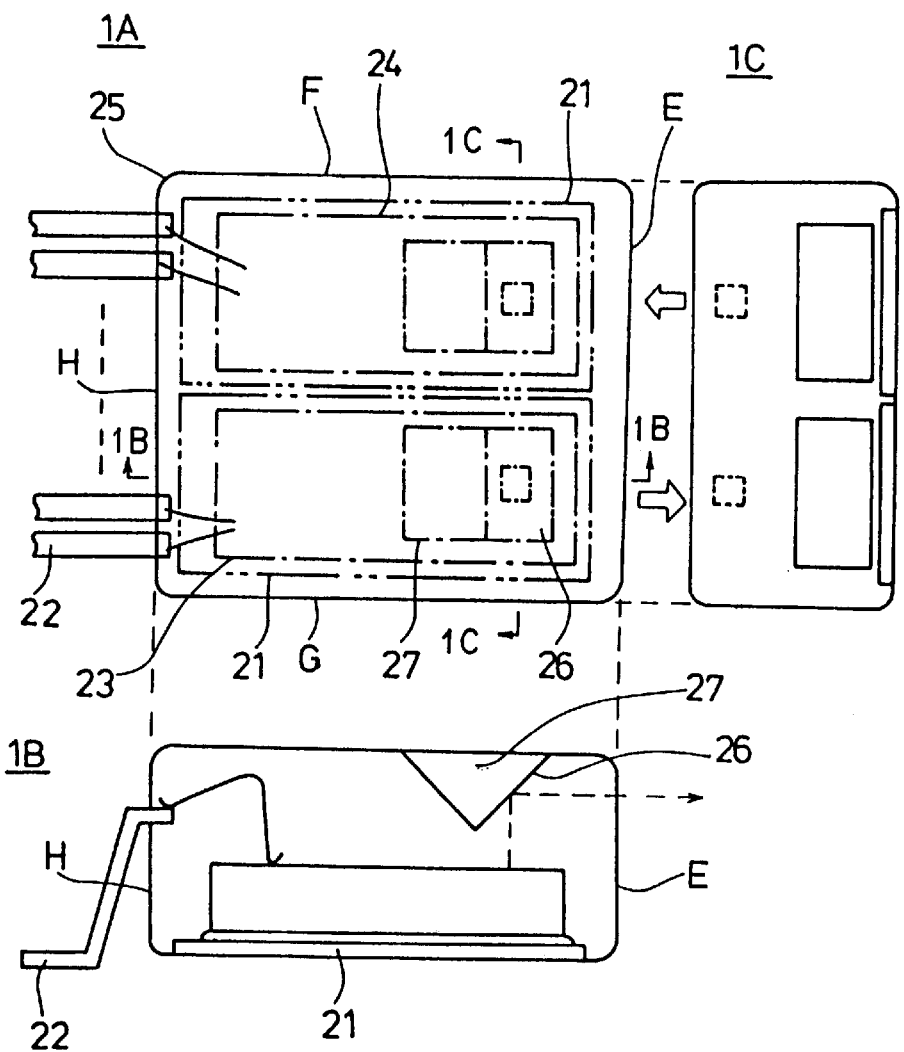
FIGS. 1A, 1B and 1C are a plan view, a sectional view and another sectional view of an optical semiconductor device according to a first embodiment of the present invention.

Now referring to FIG. 1, an explanation will be given of the first embodiment of the present invention.

FIG. 1A is a plan view of an optical semiconductor device according to the first embodiment of the present invention; FIG. 1B is a sectional view taken in line A—A in FIG. 1A, and FIG. 1C is a sectional view taken in line B—B in FIG. 1A.

The optical semiconductor device includes a lead frame composed of an island 21 indicated by two-dot chain line and leads 22 provided in the vicinity of island 21, light-emitting and light-receiving semiconductor chips 23 and 24, indicated by one-dot chain line, loaded on the island 21 and a mold 25 with a groove formed on its upper surface covering the lead frame and semiconductor chip on their periphery. Light is incident on an inner wall 26 of the groove 27 serving as a reflecting face from the side of the optical semiconductor device. The light is further incident on the light receiving face of the light-receiving semiconductor chip 24. On the other hand, the light emitted from the light-emitting semiconductor chip 23 is reflected from the inner wall 26 of the groove and guided to the side of the mold. The lead frame is made of Cu. The semiconductor chips 23 and 24 are secured on the lead frame by fixing means such as soldering.

The semiconductor chip 23 may be a light emitting element such as an infrared ray LED and a laser. A driving circuit for the light emitting element is integrated on the light receiving semiconductor chip 24. The light emitting element and its driving circuit may be integrated. The infrared ray LED, whose light emitting face is an upper face of the chip, is arranged horizontally on the island as seen from FIG. 1B. The semiconductor laser, from the side of which light is emitted, requires no groove. However, for convenience of fabrication, the groove may be also formed on the light emitting semiconductor chip 23.

The light receiving semiconductor chip 24 may be a photo-sensor of e.g. a PIN diode. The PIN diode may be integrated to its driving circuit, or may be integrated to the driving circuit for driving the LED or laser. Bonding pads are formed on the periphery of these semiconductor chips. Correspondingly, a plurality of leads 22 are extended externally from the periphery of these chips. The bonding pads are connected to the lead wires through fine metallic wires. The mold 25 may be made of any material which is optically transparent. Specifically, the material may be resin which can transmit the light having the wavelength used, for example, infrared rays which are generally emitted from the LED. The tips of the leads 22 and the semiconductor chips are molded by the mold 25 which is optically transparent. The groove 27 having the reflecting faces 26 is formed in the mold 25.

The most important feature of this embodiment resides in the reflecting face 26 which is provided by forming the groove 27 in the mold 25. The reflecting face 26 permits light to be incident from the side E of the mold 25 and to exit therefrom.

Figure 3:
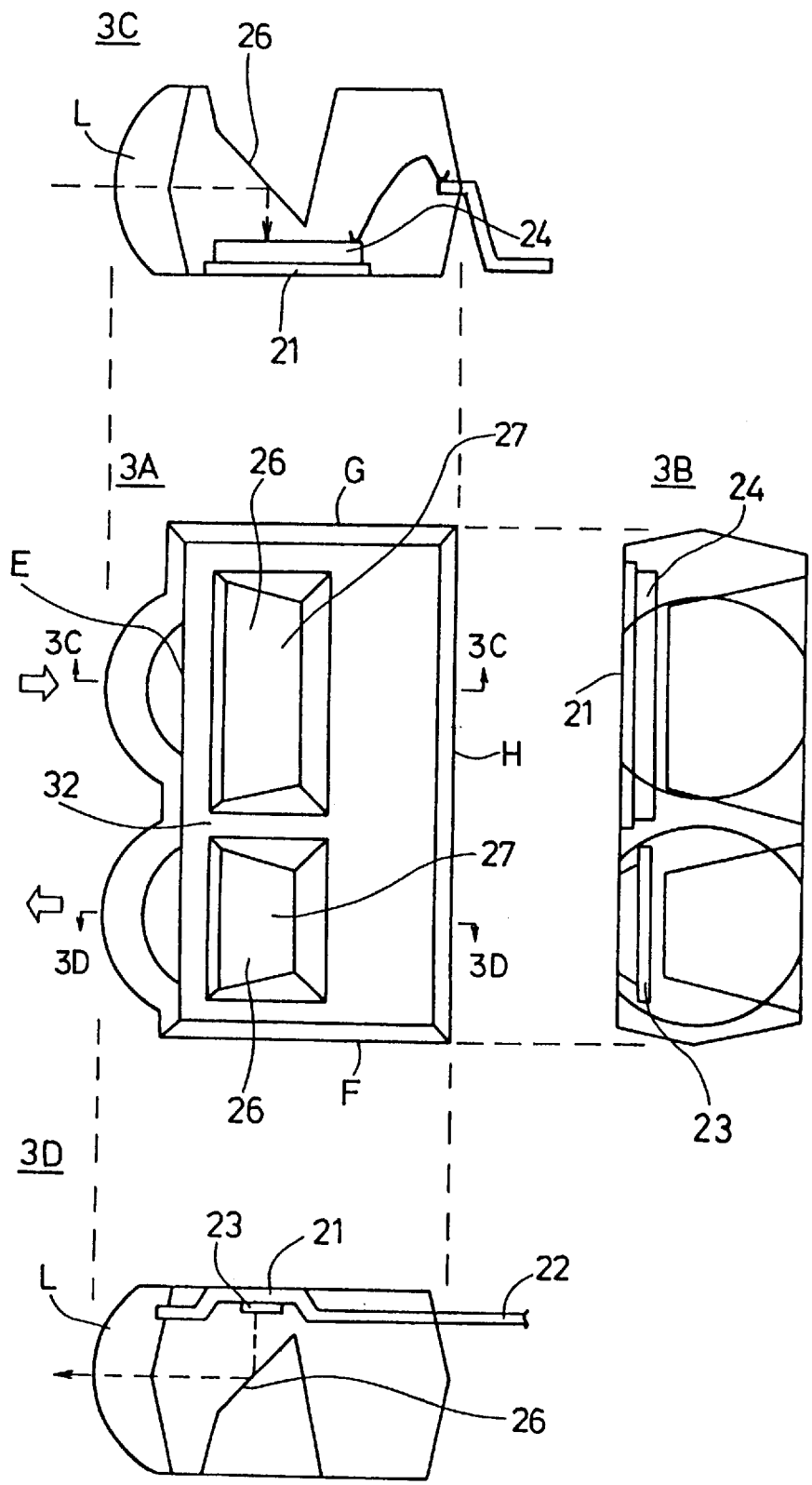
FIGS. 3A, 3B, 3C and 3D are a plan view, a sectional view and sectional views of an optical semiconductor device according to a second embodiment of the present invention.

Generally, the semiconductor chip which constitutes a light-emitting section or a light receiving section must be provided with a prism and a lens on its surface. Therefore, the module or set using such a semiconductor chip has an increased thickness in a vertical direction. In addition, because an optical device is arranged on the surface or periphery thereof, the module or set is difficult to be low-profiled or miniaturized. On the other hand, in accordance with the present invention, because of the reflecting face 26, incidence or exit of light can be made through the side E of the mold. Therefore, the prism is not required, and the lens can be provided at the side E of the mold as occasion demands. Specifically, as shown in FIG. 3, a convex lens may be integrally or individually formed on the side of the transparent mold. Thus, an increase in the thickness of the set or module can be suppressed. Particularly, where the laser beam having a small diameter is dealt with, the groove itself may be shallow so that the module can be further miniaturized or low-profiled.

The lead frame is made of Cu, and has a thickness of about 0.125 mm. The semiconductor chip has a thickness of about 250–300 $\mu$m. The mold 25 is formed by e.g. transfer molding technique using a transparent epoxy material, and has an entire thickness of about 1 mm–1.5 mm. The thickness of the mold 25 can be further decreased according to the thickness of the semiconductor chip. Since the die has an area where the groove is to be formed, when the semiconductor chip is transfer-molded, the groove is simultaneously formed.

The groove 27 may have any optional thickness as long as the semiconductor chip is not exposed and the reflecting face is formed. For example, the depth of the groove 27 is half the thickness of the mold 25, i.e. about 750 $\mu$m. The reflecting face 26 of the groove 27 is sloped by 45° with respect to the bottom face of the optical semiconductor device. The depth of the groove 27 is desired to be in a range of 20–30 $\mu$m. The reflecting face constitutes a reflecting plane because of a difference in the refractive index between the air and transparent resin on both sides of the boundary. However, in order to realize total internal reflection, the reflecting face may be covered with a metallic film.

Such a metallic film can be formed by means of vapor deposition and sputtering which are commonly used in the semiconductor technology. The metallic film can be also formed by plating. In this case, care should be taken of short-circuiting between the metallic film and the semiconductor chip or leads. The former two techniques require a mask for this purpose. Where the entire body is dipped in a plating solution in an electroless plating, the extended portions of the leads 22 and the mold 25 are previously covered with a resin film, and this resin film may be removed after the plating. The metallic film may be formed by dropping the solution on only the groove rather than the dipping of the entire body. The metallic film is made of Au, Al, Ni, etc.

Meanwhile, a molding die is formed by electric spark machining and satin-polished in view of the parting property of the mold product. Therefore, if the portion of the molding die corresponding to the reflecting face is mirror-polished, the corresponding portion of the mold product constitutes a mirror face, and hence may be used in the above reflecting face. The mirror face may be further covered with another metallic film. The side E, through which light travels, may be preferably mirror-polished.

In this embodiment, the leads can be arranged on the sides F, G and H other than the side E through which light travels. However, in view of the reflection of light by the metallic wires or leads, the leads are preferably arranged on the side H. As seen from the plan view of FIG. 1A, the light receiving section 24 includes a substantial light-receiving element area (first area) on the right side and a driving element area therefor (second area). In this case, since light does not travel through the second area, this area can be used as the area for extending the leads or pulling the metallic wires, thereby preventing noise by light reflection from invading the first area. Since the first area is displaced towards the right side, the groove 27 is necessarily displaced toward the right side. The area on the left side of the groove can be assured as an area for extending the metallic wires. If the first area is located on the center or left side, the metallic wires may be extruded from the groove.

The optical semiconductor device described above can be mounted on e.g. a printed substrate, ceramic substrate, insulating metallic substrate, or resin film such as TAB or FPC so that it is arranged horizontally. Thus, a low-profiled module or system can be provided.

For example, if an IC card equipped with such a semiconductor device permits the thickness of the card itself to be reduced and communication of an optical signal to be carried out on the one side thereof.

Meanwhile, the island 21 is divided into two sections as indicated by two-dot chain line, but may be integrally formed. The mold 25 molds the two semiconductor chips integrally, but may mold these semiconductor chips individually. Further, the two semiconductor chips are may be fixed on the one island and may be individually molded. The lead frame may be individually molded as a discrete component.

The minimum square areas encircled by one dotted chained line are areas on which light is incident or from which light emits.

Figure 2:
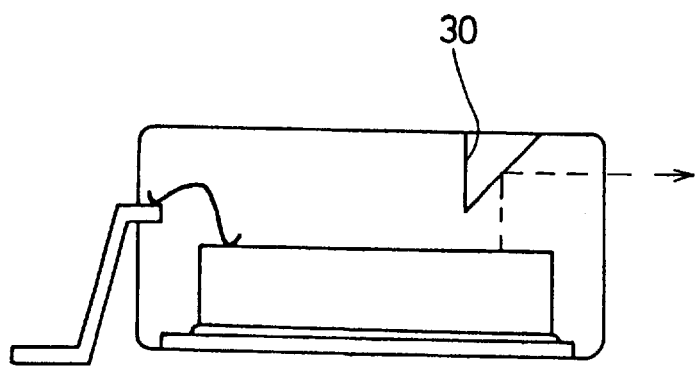
FIG. 2 is a sectional view of the optical semiconductor device for explaining a groove shown in FIG. 1.

FIG. 2 is a sectional view of the optical semiconductor device showing a modification of the groove shape. As seen from FIG. 2, one reflecting face 30 of the groove 27 is vertical. In this case, in comparison with the groove shape in FIG. 1, the left area of the groove can be assured to which the metallic wires can be extended. The second area described above can be extended to the vicinity of the reflecting face 30. In this case, if the reflecting face is vertical, the parting property of the mold product is promoted so that the reflecting face is preferably sloped left.

Embodiment 2

FIGS. 3A to 3D show a modification of the optical semiconductor device of FIG. 1. FIG. 3A is a plan view. FIG. 3B is a side view viewed from the left side. FIG. 3C is a sectional view taken in line A—A in FIG. 3A and corresponds to a photo IC. FIG. 3D is a sectional view taken in line B—B in FIG. 3A and corresponds to a light emitting diode.

Figure 4:
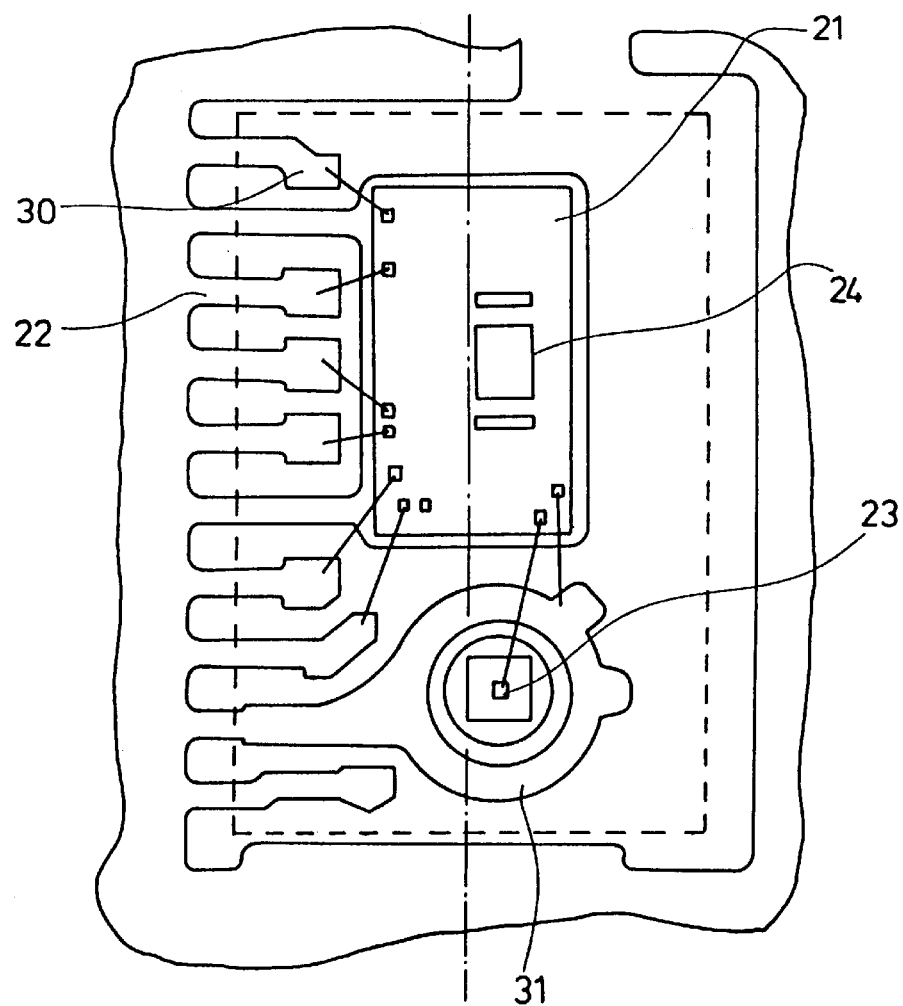
FIG. 4 is a plan view for explaining a lead frame shown in FIGS. 3A–3D.

FIG. 4 is a view showing the state where a photodiode and an LED are mounted on the lead frame of the optical semiconductor device as described above.

As seen from FIG. 4, leads 22 are extended on only the left side of an island 21. The leads each has an enlarged portion 30 at its tip. On the left side and lower side of an IC chip, bonding pads are formed. The enlarged portion 30 and the bonding pad are electrically connected by bonding wires. An island 31 where the LED is located has a cup-shape as shown in FIG. 3D so that light can fly upwards. The cup has sloping sides. The light having flied in other directions than upwards are focused by the sloped sides and thereafter guided upwards effectively. For example, it is similar to a reflecting plate (collector) which is formed on the periphery of a midget light bulb of a portable lamp. A PIN photodiode is formed on the light emitting area 24. On the periphery of the photodiode, a driving IC is formed. An LED driving circuit is formed in the vicinity of the connecting portions of two wires extended from the LED. The square area indicated by dotted line is a resin molding region.

A detailed explanation will be given of the optical semiconductor device according to this embodiment. As apparent from FIG. 3A, two grooves each constituting a reflecting face are formed. A wall body 32 is formed between these two grooves so as to separate them from each other. The groove may be formed continuously from the one side to the other side like FIG. 12. However, if external force is applied to such a structure, some crack may be generated at the bottom of the groove. In order to overcome such an inconvenience, a frame is formed so as to surround the photo IC and LED, thereby improving the strength of the mold. The face of the groove other than reflecting face is sloped at a certain angle in order to improve the parting property after molding (extracting property of the molded optical semiconductor). In order to improve the parting property of the mold product, the external shape is also sloped at a certain angle so that it is not in parallel to the drawing direction.

Lenses L each having a sectional sphere shape are provided on the side E. Each lens L may be elliptical lens. The optical semiconductor device according to this embodiment is used for an IrDA. Therefore, the lens for the upper light receiving element is designed so that an external optical signal can be effectively guided to the light receiving element and light enters the light detecting area of the light receiving element. The lens for the lower light emitting element is designed so that the emitted light can reach the detecting area of another optical semiconductor device.

Embodiment 3

Figure 5:
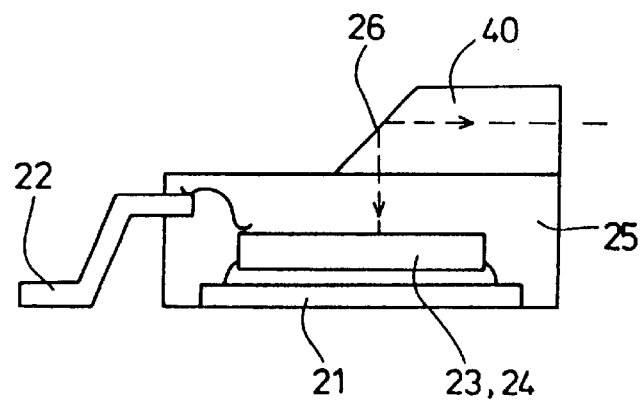
FIG. 5 is a sectional view of means constituting a reflecting face according to a third embodiment of the present invention.

FIG. 5 shows another method of forming a reflecting face. In this method, a means having a reflecting face 26 (hereinafter referred to as "prism body 40) is fixed to a resin mold which is a rectangular solid (which may be provided a taper face in view of the parting property as described above). The prism body 40 and resin mold are made of the material capable of transmitting prescribed light, and must have an optical path indicated by dotted line. In view of refraction, like the mold for the optical semiconductor device shown in FIG. 1, both are preferably integrally molded. However, they may be fixed to each other as discrete components. In this case, the refractive indexes inclusive of that of fixing adhesive are preferably substantially equal to one another.

Figure 6:
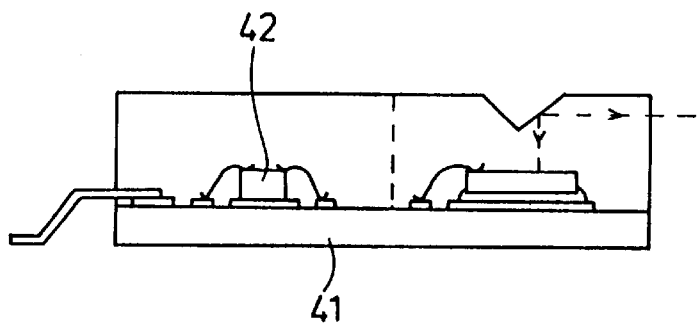
FIG. 6 is a sectional view of an application of the optical semiconductor device to a hybrid substrate.

FIG. 6 shows a modification of the manner of mounting the semiconductor chip. In this manner, a hybrid IC is used in which a plurality of semiconductor chips 42 are loaded on a printed substrate 41 having a circuit pattern. In this way, the optical semiconductor device can be mounted on not only the lead frame, but also mounted on the printed substrate, ceramic substrate, insulating metallic substrate, and resin film such as TAB or FPC, etc.

In this case, the semiconductor chips may be bare chips of an active element and passive element. These bare chips are secured by soldering to realize a prescribed function as well as that of the optical semiconductor device. As the case may be, the printed substrate may incorporate molded chips.

For example, the metallic substrate generally has a frame member formed on the periphery and filled with epoxy resin. In this case also, the right region of dotted line is preferably a material which can transmit at least prescribed light. Further, the portion corresponding to the light passage must be made of a material permeable to the light. Where the substrate is molded in full mode, its entity must be made of the material capable of transmitting the light.

The ceramic substrate is frequently molded in full mode as in the case of FIG. 2. Therefore, its entirety is preferably made of the material capable of transmitting prescribed light. Further, the printed substrate is generally provided with the molded chips. Therefore, only the right side of the dotted line may be molded. However, it is reasonable to package the optical semiconductor device shown in FIG. 1 in accordance with the manner illustrated in FIG. 12.

Figure 7:
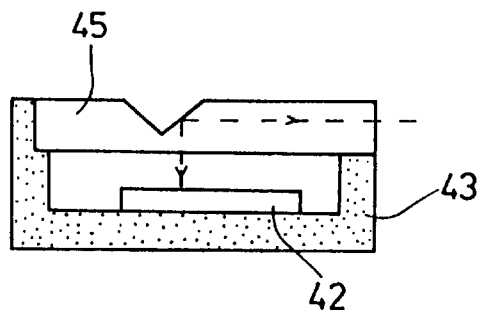
FIG. 7 is a sectional view of an application of the optical semiconductor device to a ceramic package.
Figure 8:
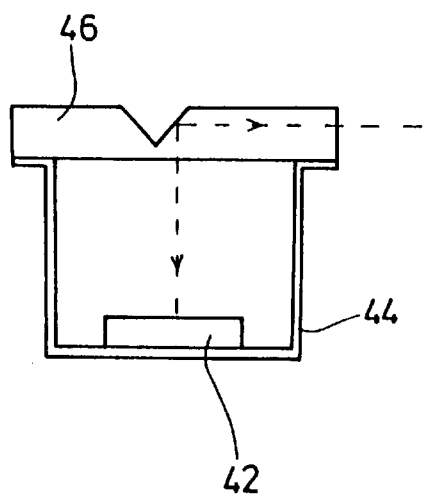
FIG. 8 is a sectional view of an application of the optical semiconductor device to a can type package.

FIG. 7 shows an application of the optical semiconductor device to a ceramic package. A semiconductor chip 42 is mounted in the ceramic package 43. The cover for the package is formed of a transparent prism body 45 having a reflecting surface. FIG. 8 shows an application of the optical semiconductor device to a metal can. As seen from FIG. 8, a semiconductor chip 42 is mounted within a can 44. The cover for the can is formed of a transparent prism body 46 having a reflecting face. The ceramic package 43 and can 44 are made of the material not capable of transmitting light and hollow in their interior. Therefore, the transparent prisms 45 and 46 which are permeable to light and have reflecting faces are provided at the cover portions, respectively. In these configurations, the light path is bent as indicated by dotted line at 90° so that the light enters or outgoes horizontally. Incidentally, FIGS. 7 and 8 are used for explaining the mold so that leads, electrodes and metallic wires, etc. are not shown.

The other lead frame than that shown in FIG. 4 can be also used as long as it is generally used in a field of semiconductor technique. In this case, in view of the stability of the island which is influenced by the resin pressure in molding, hanging leads are preferably located on the opposite sides. Further, "four-direction handing leads" extending from four corners of the island also contributes to the stability of the island and makes uniform the directivity of light in the product.

The molding structure can be designed in various forms. As disclosed in "Electronics (published in Japan: October 1997, pages 74 - ), the type in which leads of a package are inserted into through-holes, i.e. lead-in type may be an in-type SIP, HSIP, ZIP, etc or a dual-line type DIP, HDI, SDIP, WDIP, PGA (pin grid array), etc. The surface packaging type, in which the device is mounted on the surface of a substrate by direct soldering using soldering cream, may be SVP, SOP, SSOP, TSOP, HSOP, QFP, TQFP, HQFP, QFN, SOJ, QFJ, BGA, LGA, DTP, QTP, etc.

Of course, the face-up or face-down type may be adopted. The CSP (chip size package) structure which is recently most talked about can be used.

Figure 9:
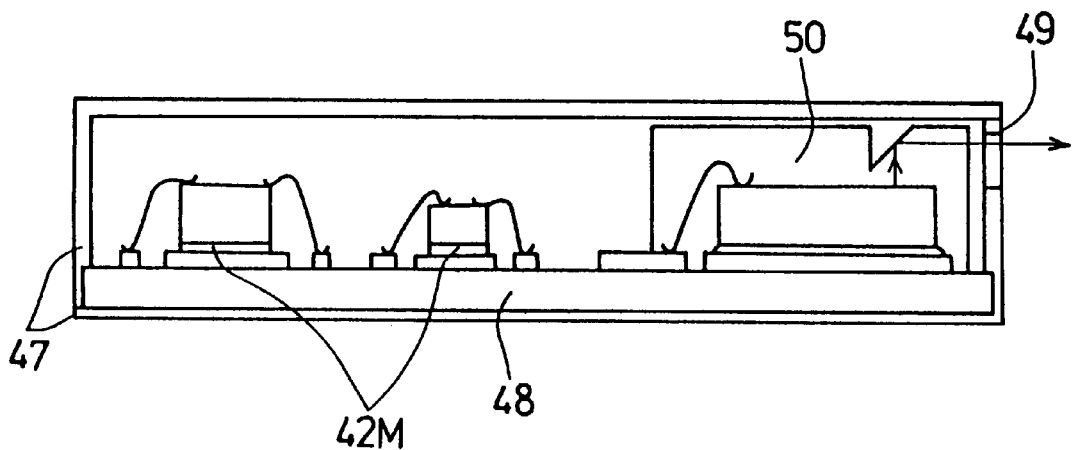
FIG. 9 is a sectional view of an application of the optical semiconductor device to a IC card.
Figure 10:
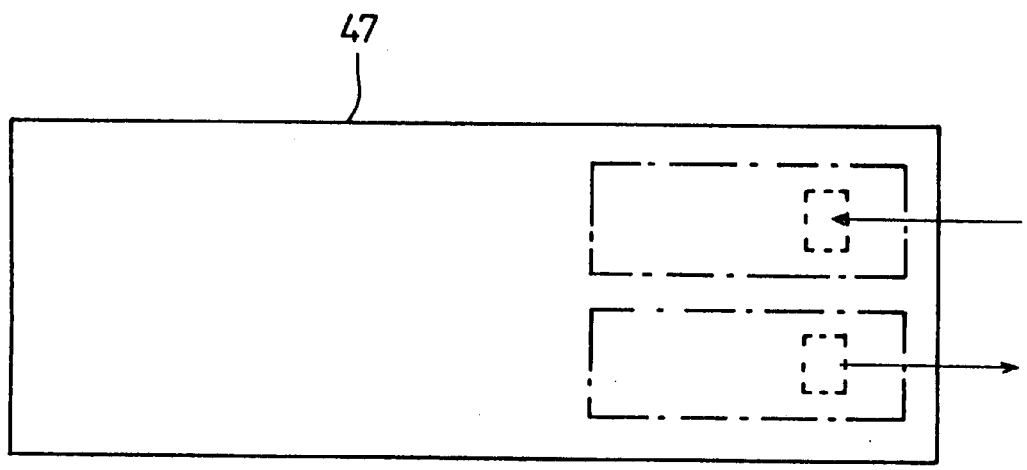
FIG. 10 is a schematic plan view of FIG. 9.
Figure 11:
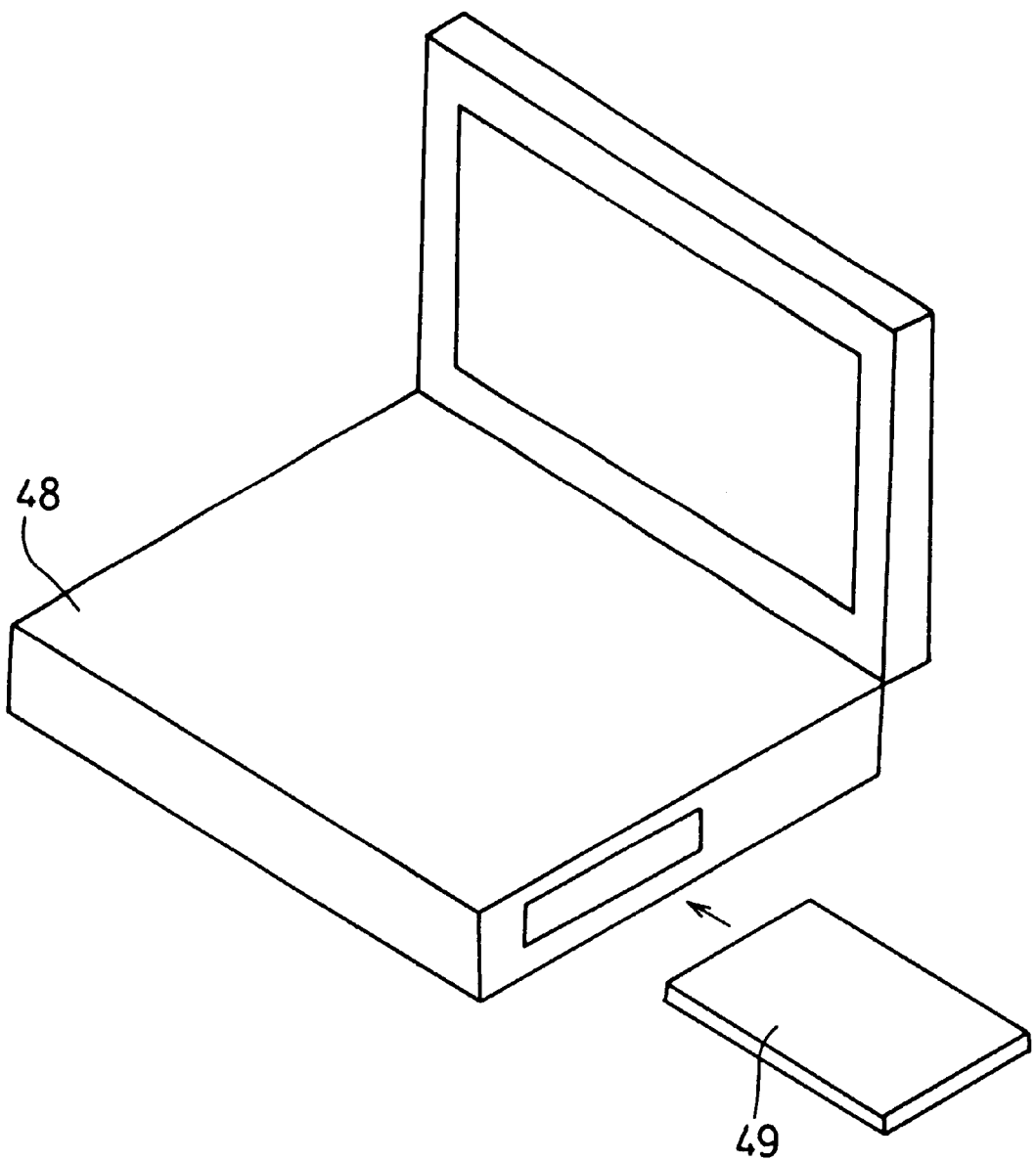
FIG. 11 is a perspective view showing the relationship between the IC card and a computer.

FIGS. 9, 10 and 11 show an example of the structure of an IC card. As seen, a printed circuit board 48 on which a semiconductor chip 42 constituting a circuit element is soldered is accommodated in a metallic case 47. The inlet/outlet of light of the case 47 is opened or made of transparent material such as glass or plastic. An optical semiconductor device 50 is integrally molded on the substrate of the printed circuit board 48 (the components as shown in FIG. 1 may be packaged). FIG. 10 is a schematic plan view of the IC card. Light is emitted from the right side of the IC card. Otherwise, the light is taken in from the outside and converted into an electric signal by an optical IC. The converted signal is stored in a memory chip 42M such as flash memory, FRAM, etc.

FIG. 11 explains a method of using the IC card in order to realize an IrDA of a personal computer 48 and an IC card 49. A power supply for the IC card may be a built-in battery or a coil for electromagnetic induction. The light can contain a large amount of data and runs at a high speed, thereby realizing optical communication at a high speed. Unlike communication of electric signals, the optical communication does not require the electric connection for signals. This does not lead to reduction of reliability due to poor electric connection.

Figure 12:
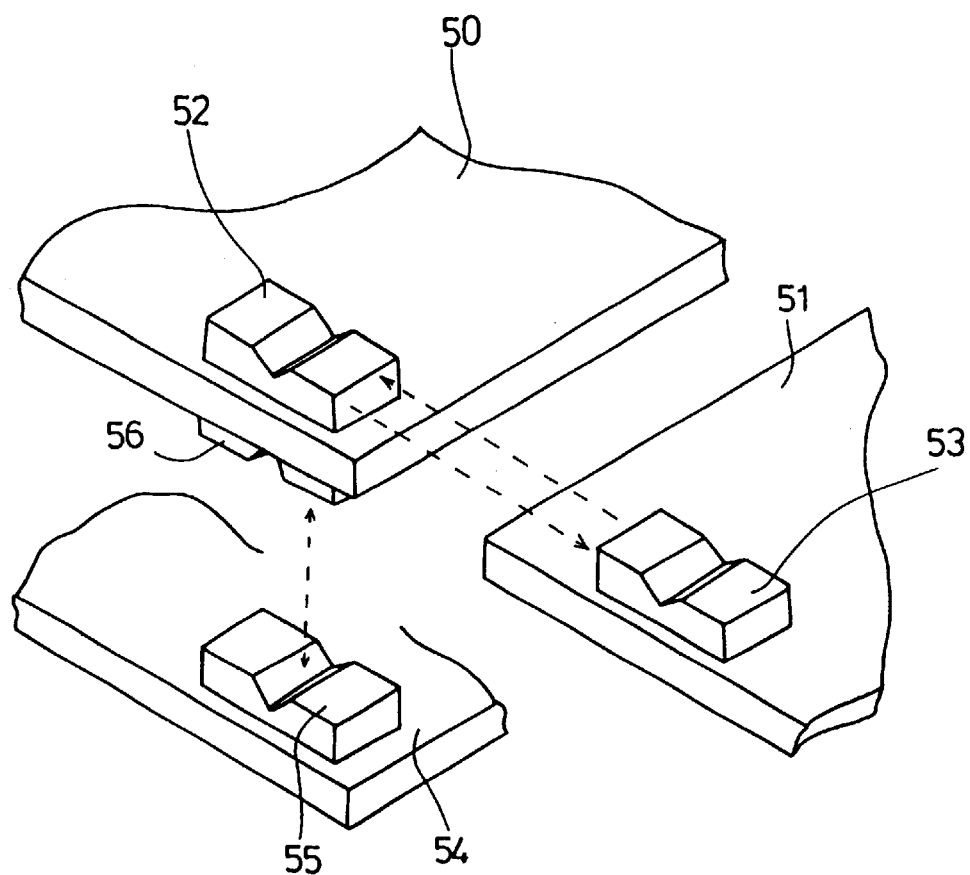
FIG. 12 is a view for explaining the manner of mounting the optical semiconductor device on a circuit board arranged three-dimensionally.

FIG. 12 shows a configuration in which the optical semiconductor devices 52 and 53 according to the present invention are mounted on circuit boards 50 and 51, respectively, to realize signal communication therebetween. In this configuration, using the reflecting face of a beam splitter or "half mirror" as shown in FIG. 1, an optical signal is also transmitted upwards. An optical semiconductor device 56 is also mounted on the back face of the circuit board 50. Further, an optical semiconductor device 55 is mounted on another circuit board 54. Optical communication in a vertical direction is realized between the optical semiconductor devices 55 and 56. In such a configuration, no electric wiring is required for signal communication among the circuit boards arranged horizontally and vertically.

Figure 13:
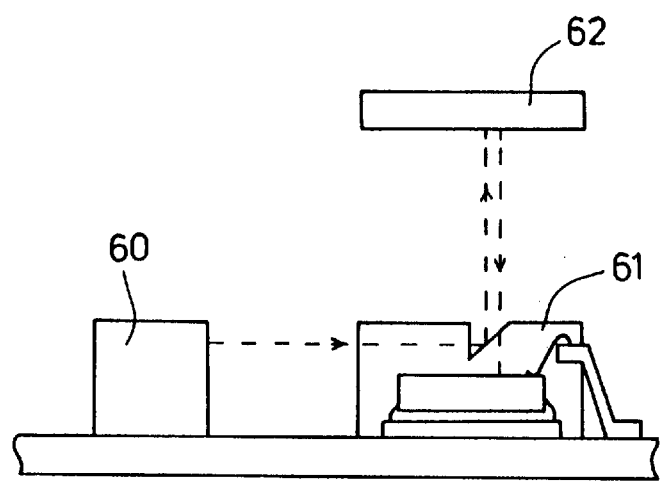
FIG. 13 is a view of an application of the optical semiconductor device to an optical pick-up.
Figure 15:
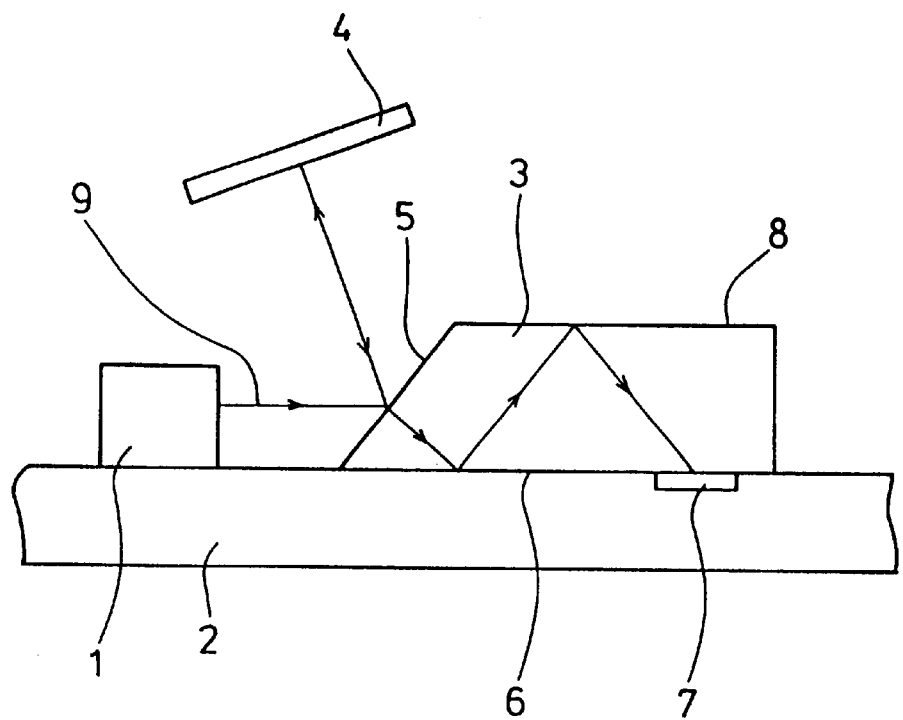
FIG. 15 is a module in which a conventional optical semiconductor device and an optical device are combined.

FIG. 13 shows an application of the optical semiconductor device according to the present invention to an optical pick-up. It shows a manner of regenerating the read for the optical medium as shown in FIG. 15. The light emitted form a laser 60 once flies into a recording medium 62 through a reflecting face of a beam splitter of the optical semiconductor device 61 according to the present invention. The light is reflected to enter the optical IC of the optical semiconductor device through the reflecting face of the beam splitter, thereby deciding the status of "1" and "0" of the information recorded on the recording medium.

Figure 14:
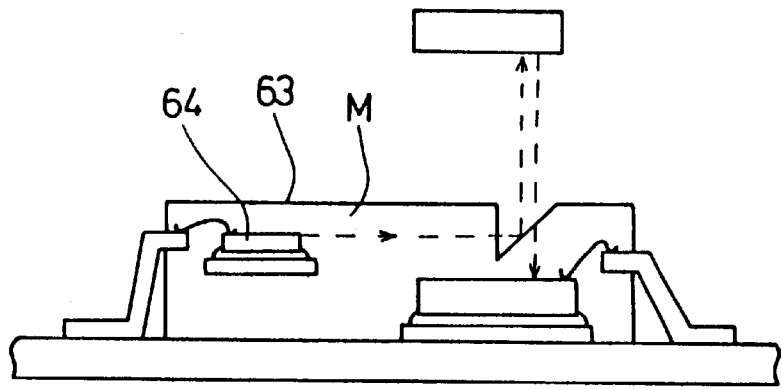
FIG. 14 is a view of another application of the optical semiconductor device to an optical pick-up.

FIG. 14 shows another application of the optical semiconductor device into an optical pick-up. In FIG. 14, an optical semiconductor device 63 as well as a laser 64 are integrally molded in a mold M. A light emitting face, light receiving face and a recording medium are arranged in proximity so as to include the same plane. The paths of light being incident on and exiting from the recording medium are in parallel. Since the incident light and exiting light have different wavelengths, the mold must have wavelength selectivity between the wavelengths. In a triangle structure in which the laser serving as a light emitting element and the receiving element are provided and the recording medium is attached above the sheet of paper, the angle of the reflecting face must be adjusted.

Embodiment 4

Figure 18:
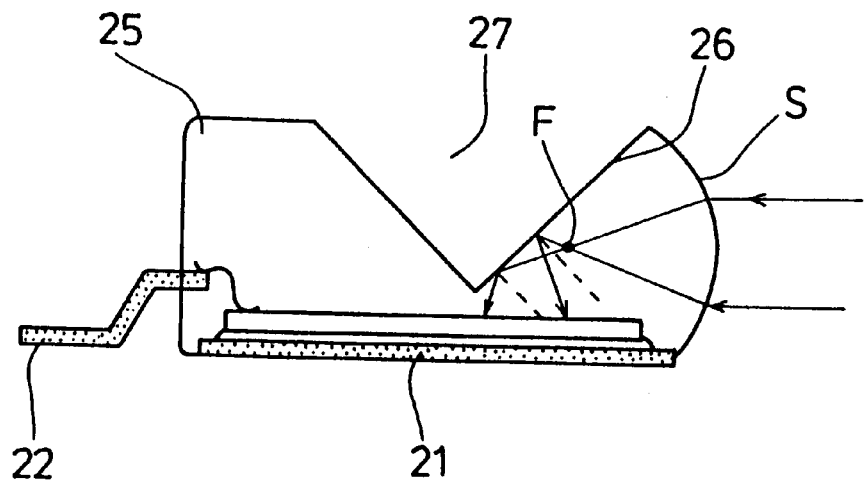
FIG. 18 is a view of an optical semiconductor device according to the fourth embodiment of the present invention.

Referring to FIG. 18, an explanation will be given of the fourth embodiment of the present invention. FIG. 18 shows a structure similar to that described in connection with the first embodiment and corresponds to the section taken in line C—C in FIG. 1. The side E corresponding to the semiconductor chip 24 for light reception is formed in a convex shape to constitute a lens S.

Figure 20:
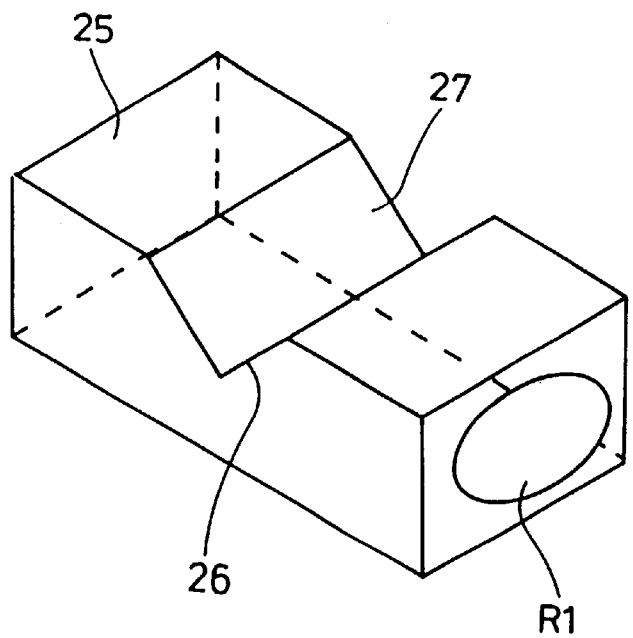
FIGS. 20 and 21 are views showing the shape of a lens used in the present invention.
Figure 21:
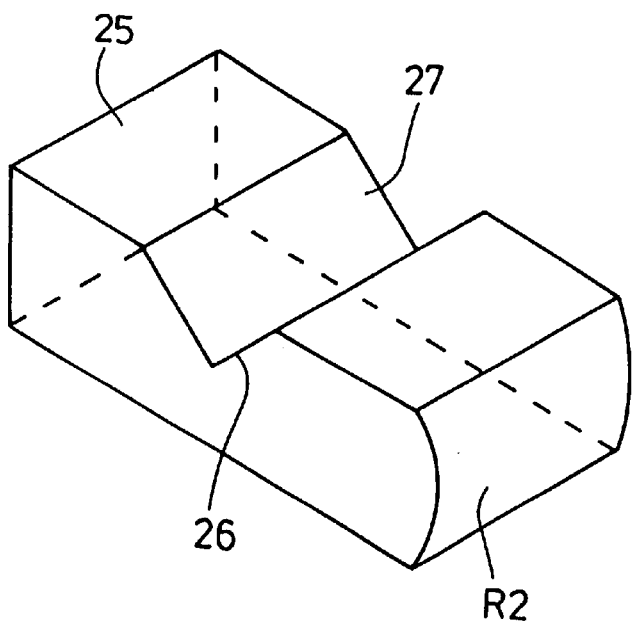

FIGS. 20 and 21 show examples of the concrete shape of the lens. In FIG. 20, a lens R1 formed by cutting a bulb made of glass or transparent resin is individually attached to the side of the mold. Otherwise, the lens R1 made of the same material as that of the mold is formed integrally to the mold when the mold is molded. Such a configuration permits the light incident to the mold to be gathered from all directions.

In FIG. 21, a lens body R2 formed by vertically cutting a cylinder is attached to the side of the mold. The lens R2 has a sectional shape encircled by an arc and chord. The one side of the lens body R2 has the same shape as or similar shape to that of the side shape of the mold. The lens body may be individually attached to the side, or otherwise may be formed integrally to the mold when the mold is molded. The lens shape shown in FIG. 21, unlike that of FIG. 20, permits the light incident on the side of the mold from above and below to be focused.

In this embodiment, the light receiving section and light emitting section are integrally molded. However, only the semiconductor chip 24 may be molded as a discrete element, otherwise the light receiving section and light emitting section on one island may be individually resin-molded. The pertinent side is made convex as described above.

Figure 19:
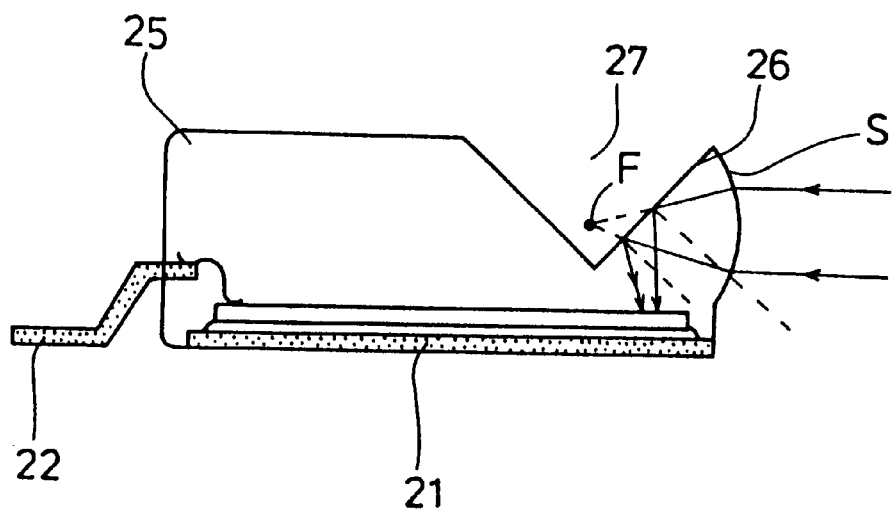
FIG. 19 is a view of an optical semiconductor device according to another embodiment of the present invention.

The structures shown in FIGS. 18 and 19 are different in their focal points. In the former, the focal point is located in the mold whereas in the latter, it is outside the mold.

Now it is assumed that the coherent light such as laser light is incident on the side S having a prescribed curvature. The light passes through the focal point F. Therefore, by adjusting the position of the focal point, the distance between the reflecting face and side face, and that between the reflecting face and light-receiving face, the light flux projected on the reflecting face can be converged more greatly than the light flux incident on the side S.

In the structure of FIG. 18, the light flux projected on the reflecting face is slightly enlarged. On the other hand, in the structure of FIG. 19, the light flux can be further converged.

Thus, if the position of the focal point (where the focal point is located rightward or leftward for the reflecting face 26), and distances between the side S and reflecting face and between the reflecting face and the semiconductor chip are adjusted, the light incident on the side E can be converged into the semiconductor chip. Thus, the density of the energy incident on the sensor as the light receiving section can be increased, thereby boosting the sensitivity of the sensor. In the optical IC to which the driving circuit is integrated, even if the area of the light receiving section is small, the light converged by the above adjustment can be made incident on only the light receiving section.

Figure 23:
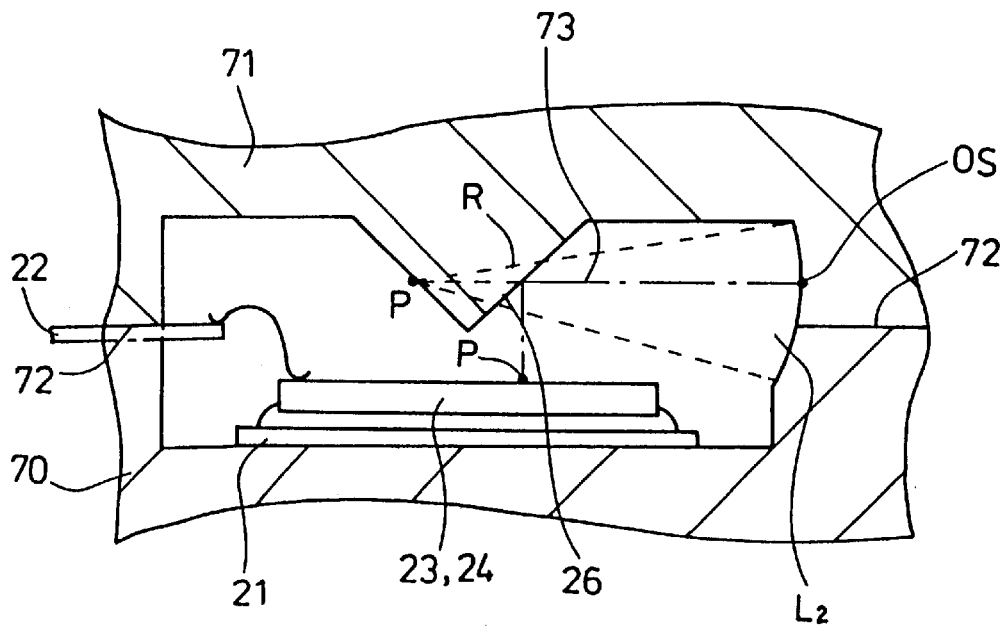
FIG. 23 is a view for explaining a problem in the method of molding the optical semiconductor device according to the present invention.

An explanation will be given of a molding die for the module according to this embodiment. First, the convex portion serving as a lens for converging the light flux must be provided. To this end, a cavity having a sectional arc as shown in FIG. 23 was formed which is used to attach the lens L2 to the side of the mold. Such a structure, however, has the following problems. The extreme end OS of the lens L2 (maximum protruding point of the lens L2) is located on an upper side molding die so that the mold could not be separated after molding.

Figure 16:
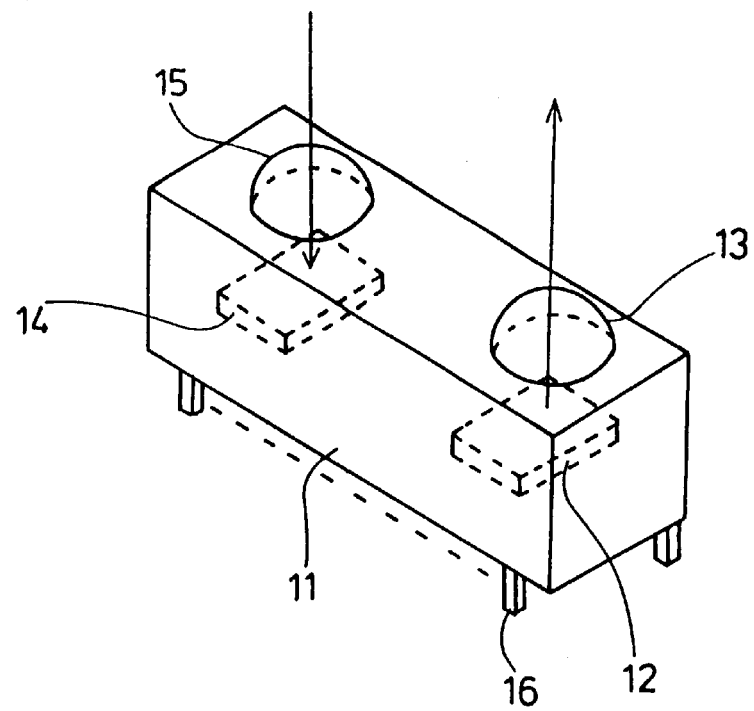
FIG. 16 is a schematic view of another conventional optical semiconductor device.
Figure 17:
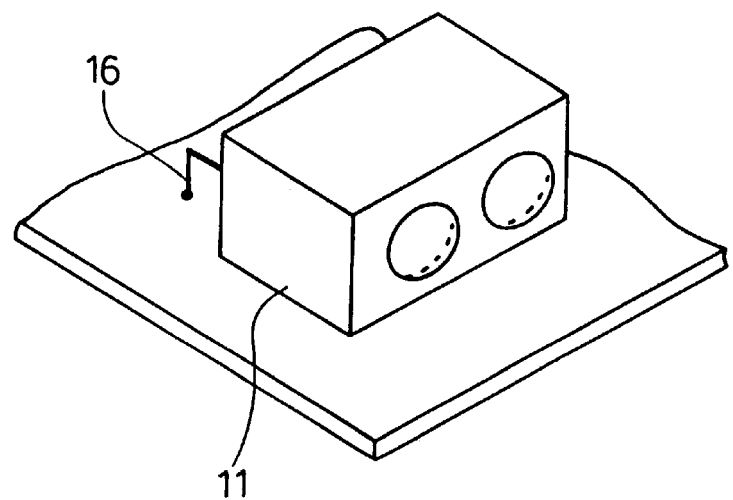
FIG. 17 is a schematic view of a conventional optical semiconductor device attached to a circuit board.

This problem did not occur in the conventional structure as shown in FIG. 16. Specifically, the portion corresponding to the extreme portion OS of the lens is oriented upward so that it is not necessary to take the parting property into consideration.

Figure 22:
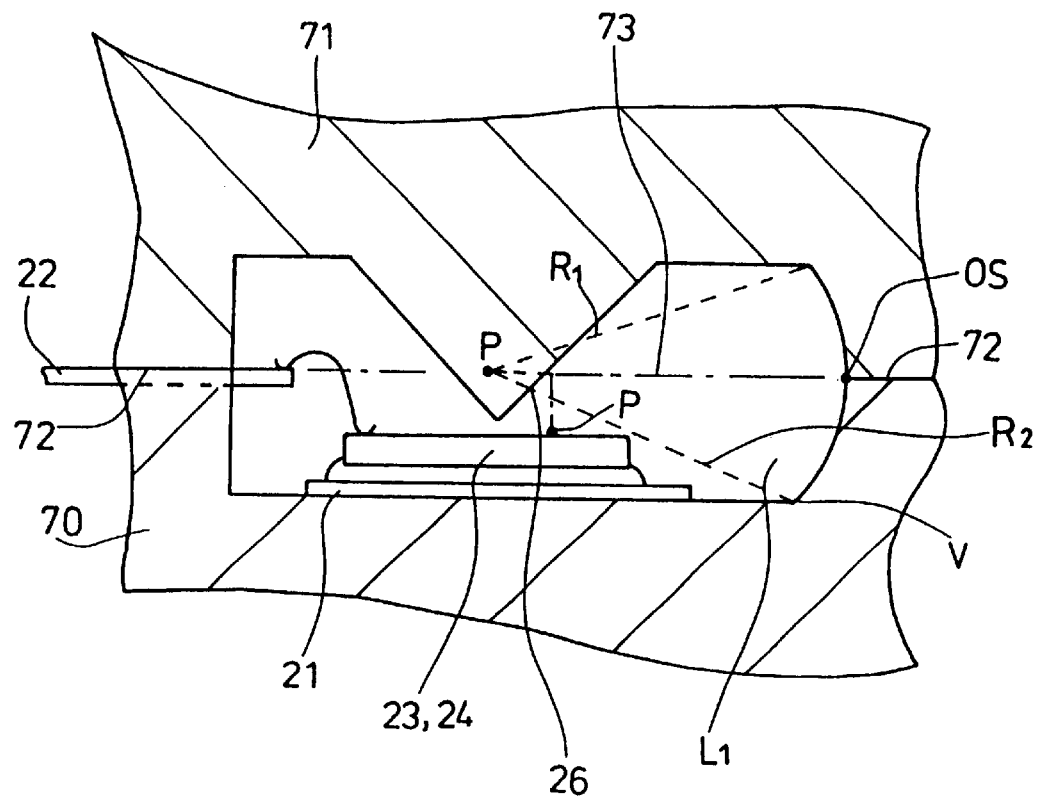
FIG. 22 is a view for explaining the method of molding the optical semiconductor device according to the present invention.

In the optical semiconductor device according to this embodiment, the conditions of precision of positioning the optical path and keeping a mounting substrate in contact with a lower die 70, the lens must be formed so as to extend across an upper die 71 and the lower die 70. Therefore, as shown in FIG. 22, the extreme end OS of the lens L1 must be aligned with the junction face 72 between the upper die 70 and the lower die 71. Further, the reflecting face 26 must be formed deeply so that the segment R2 of connecting the lower end V of the lens L1 to the focal point P crosses it. In FIG. 22, the focal point is formed to be located on the surface of the semiconductor chip. However, in order to guide spot-like light having a certain area to the light receiving semiconductor chip, the surface must be slightly displaced from the focal point P. In this case also, the reflecting face must cross the segment R2. Incidentally, R1 and R2 denotes a radius of the sphere L.

Generally, in molding, a lead 22 is embedded in the lower die 70. Taking resin burr into consideration, the surface of the lead 22 must be aligned with the junction face. The position of the extreme end OS and the surface of the lead 22 must be virtually flush with each other to provide no gap.

Thus, the optical semiconductor device thus molded can be easily separated from the molding die so that it can have a good molding structure with no burr.

The internal face of the molding cavity is preferably mirror-finished in the area constituting a lens and reflecting face and satin-finished in the other area. The cavity inner wall of the region corresponding to the reflecting face preferably has surface coarseness of 0.5 $\mu$m or less which is smaller than the other region.

Use of the molding die having the above configuration permits the molded mold to have an very improved mirror face, thereby providing a lens and reflecting mirror. Further, since the remaining region is satin-finished, random reflection can be generated, thereby reflecting unnecessary light from the exterior. Thus, the optical semiconductor device can realize very efficient reflection. Particularly, if the virtual segment formed by the lowest end of the lens and focal point of the lens is designed to cross the above reflecting face, very efficient reflection can be realized. Further, satin-finishing of the surface improves the parting property of the molded product in the molding cavity.

Since the reflecting face is formed internally in the mold, the shape of the molding die and the surface condition of the molding cavity have only to be controlled to unify a improved optical system. Thus, a compact and reliable optical semiconductor device can be obtained.

Furthermore, selecting molding resin permits optical constants such as a phase and refractive index to be controlled. If the size and shape of the molding cavity are adjusted so that the relative positions between a supporting body such as a lead frame and molding die are precisely located, the focal point can be precisely controlled. Thus, the optical semiconductor device which is very reliable and can be mass produced can be provided.

Furthermore, in this embodiment, transparent resin was used as molding resin. However, other materials may be used.

In this embodiment, both the semiconductor chips for light emission and light reception were simultaneously resin-molded in their bare-chip state. However, in the case of the optical semiconductor device which intends to detect a prescribed wavelength, the side of the light receiving element may be previously molded using the resin having wavelength dependency such as transparency to a prescribed wavelength on the side of the light receiving element. Thereafter, the entire semiconductor device may be molded.

Embodiment 5

Figure 24:
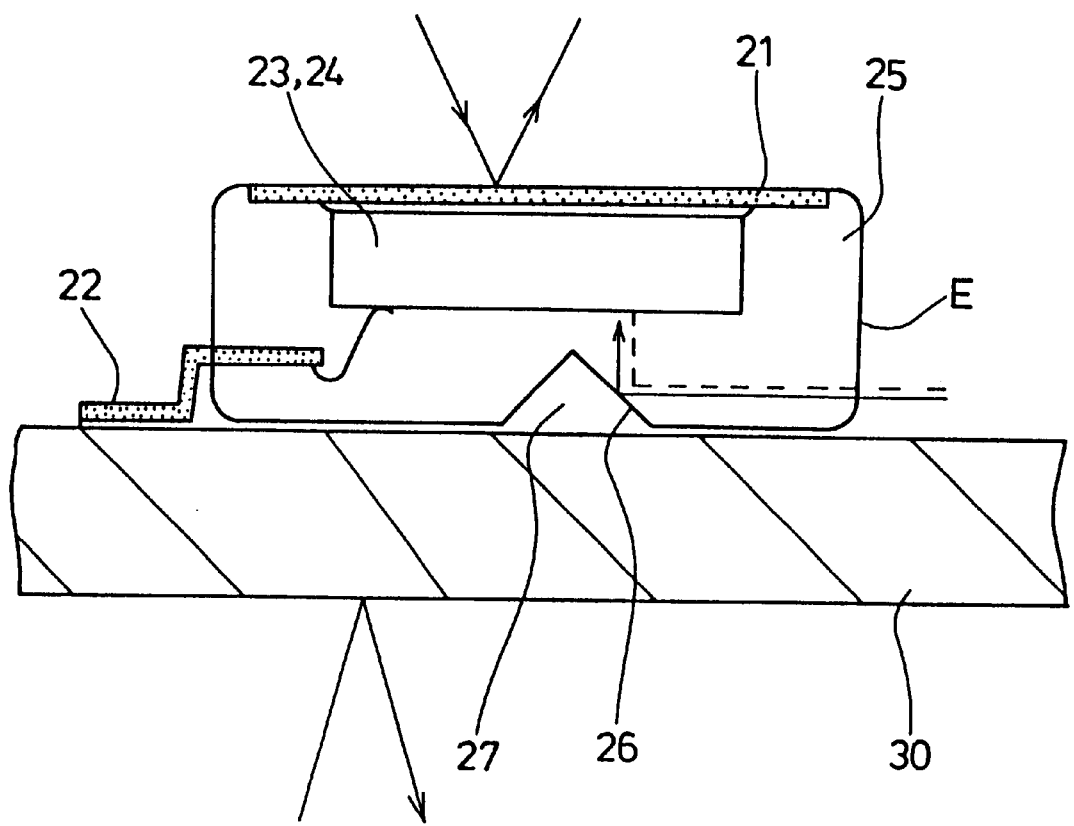
FIG. 24 is a view for explaining the manner of setting an optical semiconductor device according to the fifth embodiment in a substrate.

Referring to FIG. 24 and FIGS. 25A–25C, an explanation will be given of a mounting structure for removing optical noise invading from the environment of the transparent resin. FIG. 24 is a sectional view of the structure. FIG. 25A is a plan view; FIG. 25B is a sectional view taken in line A—A and FIG. 25C is a sectional view taken in line B—B.

In this structure, the lead 22 is bent in a direction reverse to a normal manner. The substrate for supporting a semiconductor chip, i.e. an island 21 of the lead frame is located on the upper side to shade the light from above, whereas the groove 27 constituting the reflecting face 26 is located on the lower side. Therefore, the semiconductor chips 23 and 24 are sandwiched between the upper island 21 and the lower mounting substrate. Such a structure permits the light from above and below to be shaded and the light from the side to be received or emitted. The remaining components are entirely the same as the first embodiment.

Specifically, the mounting substrate 30 in which the optical semiconductor device is mounted, i.e. printed board, ceramic substrate, and a metallic substrate which are generally adopted in e.g. hybrid integrated circuit device has a light shading effect. The island of the lead frame and the supporting substrate such as a heat dissipating plate have the same light shading effect. If these island and supporting substrate are located on the upper side, the light receiving element and light emitting element are sandwiched by the upper and lower shading plates so that the invasion of the optical noise can be suppressed as indicated by arrow in FIG. 24.

Embodiment 6

Referring to FIGS. 27A–27C, an explanation will be given of a lens structure and shape of a reflecting mirror for improving light convergence. FIG. 27A is an upper plan view; FIG. 27B is a sectional view taken in line A—A and FIG. 27C is a sectional view taken in line B—B.

As seen from FIG. 27A, this structure is designed so that the lens and reflecting mirror are formed in a three-dimensional structure. In this structure, the upper/lower and left/right portions are converged so that the reflecting face is divided into four faces. In FIG. 27A, the light incident on the left side and right side of the lens is focused by the reflecting face bent in a hill shape. In FIG. 27C, the light incident on the lens from above and below can be focused by the reflecting face bent in the hill shape.

In this way, the light incident on the margin of each of the upper/lower and left/right faces can also be effectively guided to the light receiving surface, thereby improving the light receiving sensitivity of the optical semiconductor device. In this case, using a concave mirror having the same shape in all sections permits the light focusing efficiency to be further improved.

What is claimed is:

1. An optical semiconductor device comprising:
   a semiconductor chip having a light emitting face or a light receiving face; and
   a resin mold package for embedding said semiconductor chip, having a reflecting face arranged to form a constant angle with said light emitting face or light receiving face, wherein
   an optical path of light directly exiting from the resin package or being incident directly on the resin package is bent through said reflecting face.

2. An optical semiconductor device according to claim 1, wherein said semiconductor chip is a chip having the light receiving face,
   said resin mold package has the reflecting face arranged to cross a perpendicular line of the light receiving face at a constant angle, and
   said optical path is formed so that the light incident from a side of said resin mold package is bent by said reflecting face and incident on said light receiving face.

3. An optical semiconductor device according to claim 1, wherein said semiconductor chip is a chip having the light emitting face,
   said resin mold package has the reflecting face arranged to cross a perpendicular line of the light emitting face at a constant angle, and
   said optical path is formed to exit at the constant angle with respect to a light emitting direction through said reflecting face.

4. An optical semiconductor device according to claim 3, wherein said semiconductor chip is connected to a lead extended from a first side of said resin mold package, and the light emitted from the semiconductor chip is caused to exit through said reflecting face from a second side of said resin mold package opposite to said first side.

5. An optical semiconductor device according to claim 3, wherein said semiconductor chip is a chip having the light emitting face on its side, and
   the light emitted from said semiconductor chip is caused to emit through the reflecting face from an upper face of said resin mold package.

6. An optical semiconductor device according to claim 3, wherein said resin mold package is made of resin capable of transmitting at least said light, and a face formed in the resin mold package itself constitutes said reflecting face.

7. An optical semiconductor device according to claim 6, wherein said reflecting face is a slope of a groove formed in said resin mold package.

8. An optical semiconductor device according to claim 1, wherein said resin mold package is made of a hollow package of a first material not constituting the optical path,
   said package is provided in its opening with means made of a second material capable of transmitting at least said light and constituting the optical path, and
   a face formed in said means itself constitutes said reflecting face.

9. An optical semiconductor device according to claim 8, wherein said first material is ceramic or metal, and said second material is glass or resin capable of transmitting at least said light.

10. An optical semiconductor device according to claim 9, wherein said reflecting face is a slope of a groove formed in said second material.

11. An optical semiconductor device according to claim 1, further comprising:
    a lead frame having an island on which said semiconductor is placed; and a lead electrically connected to said semiconductor chip and extended externally from said resin mold package, said lead being extended from a side opposite to a side on which light is incident.

12. An optical semiconductor device according to claim 1, wherein said semiconductor chip has an upper face serving as the light receiving face, and
    said resin mold package is made of resin capable of transmitting at least said light, and has the reflecting face arranged to cross a perpendicular line of the light receiving face at a constant angle, and a convex lens provided integrally to a side of said resin mold package.

13. An optical semiconductor device according to claim 12,
   wherein said resin mold package is provided with a lead whose upper face is flush with an extreme end of said convex lens.

14. An optical semiconductor device according to claim 1, wherein the optical path is bent through an outer surface of the resin mold package.

* * * * *